(12) United States Patent
Pullela

(10) Patent No.: US 6,297,706 B1
(45) Date of Patent: Oct. 2, 2001

(54) SINGLE STAGE VOLTAGE CONTROLLED RING OSCILLATOR

(75) Inventor: Rajasekhar Pullela, North Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/415,602

(22) Filed: Oct. 8, 1999

(51) Int. Cl.[7] ........................................ H03B 5/02
(52) U.S. Cl. ..................... 331/57; 331/135; 331/108 R; 331/177 R
(58) Field of Search ............................. 327/264, 261, 327/271, 266, 274; 331/108 R, 135, 57, 108 B, 177 R

(56) References Cited

U.S. PATENT DOCUMENTS 4,818,952 * 4/1989 Kawano et al. ................. 331/108 R
5,581,215 * 12/1996 Ogasawara ........................ 331/45

OTHER PUBLICATIONS

Kenichi Ohhata et al., "Design of a 32.7–Ghz Bandwidth AGC Amplifier IC with Wide Dynamic Range Implemented in SIGe HBT", *IEEE Journal of Solid–State Circuits*, vol. 34, No. 9, Sep. 1999.

* cited by examiner

*Primary Examiner*—Arnold Kinkead
(74) *Attorney, Agent, or Firm*—Darby & Darby

(57) ABSTRACT

A single stage voltage controlled ring oscillator includes a trans-admittance voltage-to-current circuit coupled to a trans-impedance voltage-to-current circuit. The output of the trans-impedance circuit is connected to the input of the trans-admittance circuit. The trans-admittance and trans-impedance circuit are preferably conjugately matched and may be coupled to each other via one or more transmission lines, the length of which can be selected to set a desired nominal oscillation frequency. The trans-impedance and trans-admittance circuits may also include voltage-controllable components which can be adjusted to tune the oscillation frequency.

5 Claims, 2 Drawing Sheets

SINGLE STAGE VOLTAGE CONTROLLED RING OSCILLATOR

FIELD OF THE INVENTION

This invention is related to a ring oscillator circuit.

BACKGROUND

In many types of electronic circuits, it is necessary to generate an internal clock signal. A simple circuit for generating such a signal is a conventional ring oscillator circuit, such as shown in FIG. 1. Such a circuit 10 includes a plurality of series-coupled inverters 12a, 12b, and a cross-coupled feedback path 14 connecting the output of the last inverter 12b to the input of the first inverter 12a. In order for such a circuit to oscillate, the overall gain in the loop must be greater than one. In addition, the overall phase shift must be 180 degrees, and thus at least two stages are required to introduce the two poles required for this phase shift. The frequency of oscillation of a conventional ring oscillator is related to the delay between each of the stages, which delay is a result of the type of inverter circuit used as well as the magnitude of parasitic capacitances, Cp, which are present in the circuit. If each stage introduces a delay of $\tau$, the loop delay, corresponding to the time to complete one-half a cycle, is $2\tau$. Thus, the nominal frequency of operation for a two-stage circuit, such as in FIG. 1, is $1/4\tau$.

Although easy to construct, ring oscillators are not particularly effective at high frequencies relative to the limits of technology at issue. For example, in a particular technology, a latch can be clocked at 40 GHz. In that technology, a two-stage ring oscillator typically cannot generate an output signal which has a frequency greater than 20 GHz due to the switching delay of each stage. Delay of inverters which are used in conventional ring oscillators can be reduced by decreasing their load resistance. Although this increases the operating frequency of the ring oscillator, it also reduces the small signal gain at the operating frequency. Thus, such an oscillator generally has low power at the output and is therefore subject to unacceptable levels of noise.

An alternative oscillator, suitable for high frequency applications, makes use of LC resonator circuits. A wide variety of LC oscillators are known to those of skill in the art. A drawback to this class of circuits is that they can take up a large amount of area on an integrated circuit. A further drawback is that they have a very limited range of tunability and thus require high precision during fabrication, increasing overall cost.

Accordingly, it would be advantageous to provide a modified ring oscillator configuration which has reduced loop delay and a higher gain at the desired frequency of oscillation than conventional ring oscillator circuits to thereby provide increased oscillation frequencies.

SUMMARY OF THE INVENTION

A single stage voltage controlled ring oscillator design according to the invention includes a trans-admittance (TAS) voltage-to-current circuit coupled to a trans-impedance current-to-voltage (TIS) circuit. The TAS circuit may be connected to the TIS circuit by a pair of transmission lines, the length of which can be selected according to a desired (nominal) oscillation frequency. The voltage output of the TAS is connected to the input of the TIS circuit. In addition, the circuit components are preferably conjugately matched such that the parasitic output capacitance of the TAS circuit is canceled by the input inductance of the TIS circuit to provide increased gain at the oscillation frequency. Preferably, the TIS circuit includes a tunable current driver which can be adjusted to vary the oscillation frequency. Tunable components in the TAS circuit may also be provided. The combined TAS/TIS circuits are configured to have two or more poles and therefore to introduce a sufficient phase shift to promote oscillation.

In a particular embodiment, a limiting amplifier is used for the TIS circuit. Unlike conventional limiting amplifiers, which are configured to have a relatively broad-band response so that the gain does not peak at specific frequencies, the components in the limiting amplifier are selected to provide a narrow-band response where the gain peaks at the desired oscillation frequency.

Advantageously, a TAS/TIS ring oscillator circuit according to the invention provides a higher oscillation frequency and higher power than can be realized with conventional multi-stage ring oscillator designs. Further, these increases are achieved without sacrificing the relatively small size and simplicity of a voltage controlled ring oscillator design. The circuit achieves high frequency oscillation without the use of passive inductors or varactors, thus providing a wider tuning range than that available with high-frequency LC oscillators are used.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1:
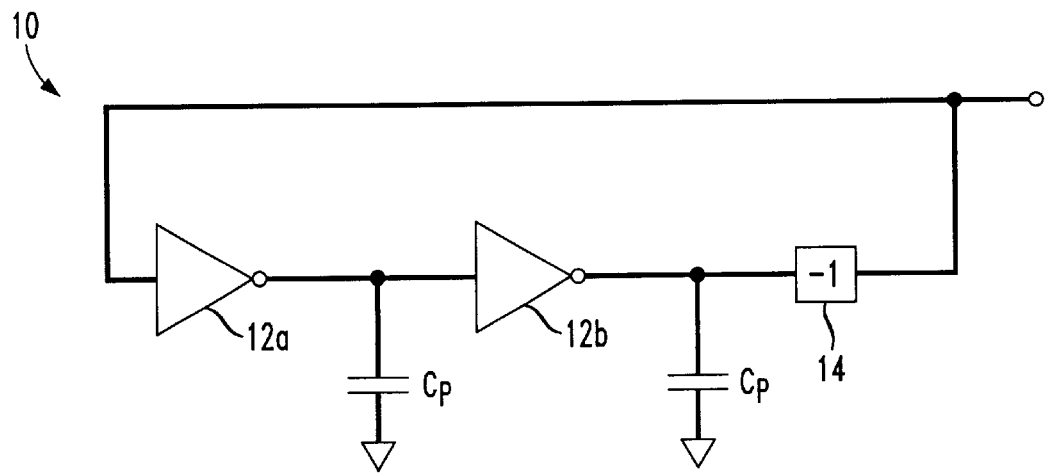
FIG. 1 is a diagram of a conventional ring oscillator circuit.
Figure 2:
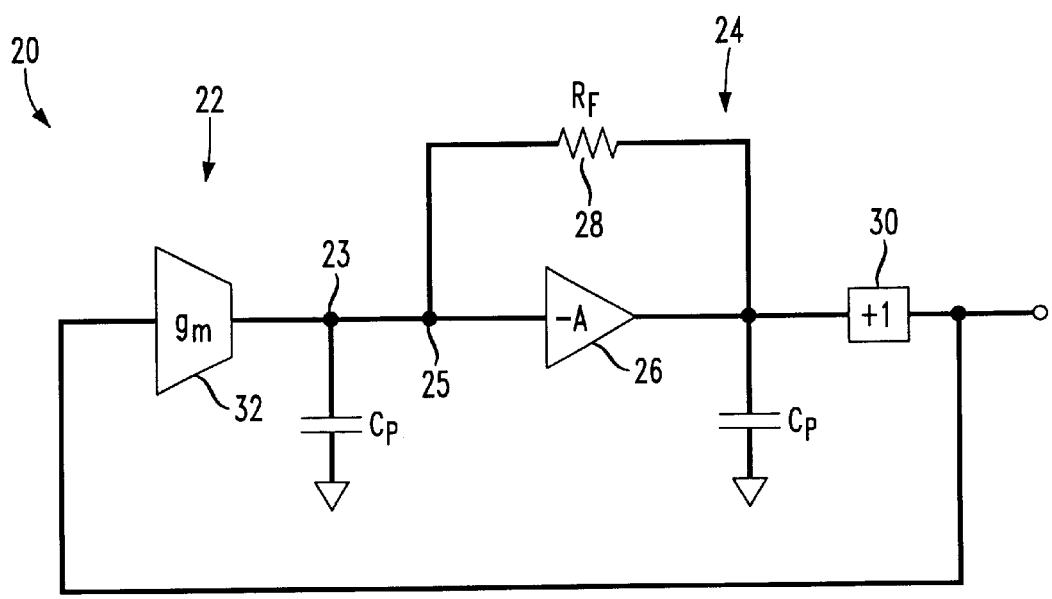
FIG. 2 is a diagram of a ring oscillator circuit according to the invention.

FIG. 2 is a block diagram of a ring oscillator 20 according to the invention. The oscillator 20 includes a trans-admittance ("TAS") voltage-to-current circuit 22 having an output 23 coupled to the input 25 of a trans-impedance ("TIS") circuit 24. The TIS circuit 24 includes an inverting current-to-voltage amplifier 26 and a feedback impedance 28. The output 30 of the TIS circuit 24 is coupled to the input 32 of the TAS circuit. Also illustrated in FIG. 2 are parasitic capacitances Cp which may be present in the circuit 20. In a preferred embodiment, the TAS and TIS circuits 22, 24 are conjugately matched such that the output capacitance of the TAS circuit 22 is canceled by the input inductance of the TIS circuit 24. This reduces the amount of energy loss in the coupling between the two circuits and thereby providing for increased loop gain and thus improved circuit performance. Various methods of conjugately matching circuits are known to those of skill in the art and therefore are not discussed in detail herein.

In a preferred embodiment of the invention, the TIS circuit 24 comprises a modified limiting amplifier design. Conventional limiting amplifiers are not generally considered suitable for use in a ring oscillator configuration because their dynamic response is deliberately configured to reduce or eliminate gain peaking which may result in oscillation. In particular, in a conventional limiting amplifier, the component values are selected such that the amplifier has a gain which remains relatively constant across a broad frequency band and does not spike at particular frequencies. In contrast, and according to this aspect of the invention, the particular component values of a modified limiting amplifier for use in the invention are selected such that the amplifier gain peaks at the frequency of interest, e.g., 40 gHz. Preferably, the selected components provide a narrow-band response at the desired frequency of oscillation.

Advantageously, a TAS/TIS ring oscillator circuit according to the invention provides a higher oscillation frequency at a higher output power that can be realized with conventional multi-stage ring oscillator designs. Further, especially when the TAS and TIS circuits 22, 24 are conjugately matched, the loop delay of the oscillator circuit 20 of the invention is less than the delay of a a conventional ring oscillator using comparable components, thus providing increased oscillation frequency.

Preferably, at least one of the TAS and TIS circuits 22, 24 include tunable circuit components which can be adjusted to vary the oscillation frequency. The oscillator 20 may also be combined with an output buffer (not shown), preferably having a gain which decreases with frequency in the range of operation of the oscillator. Such a decreasing gain buffer compensates for a tendency for the power output of oscillator 20 to increase with oscillation frequency to thereby provide a relatively constant output power across the available tuning range for the circuit.

Figure 3:
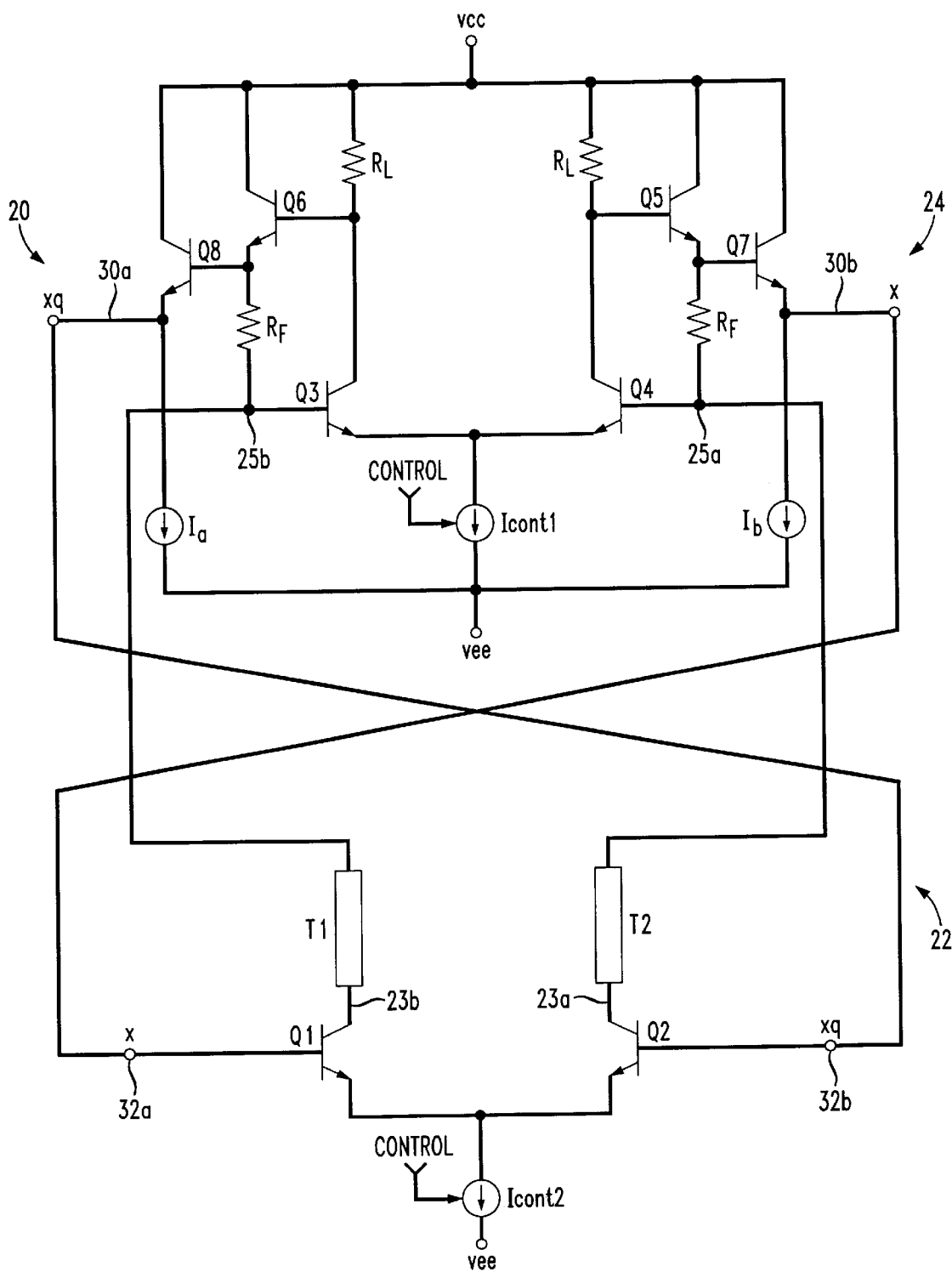
FIG. 3 is a schematic diagram of one embodiment of the ring oscillator of FIG. 2.

FIG. 3 is a schematic diagram of a preferred embodiment of the ring oscillator 20 illustrated in FIG. 2. The TAS circuit 22 includes a pair of transistors Q1 and Q2 with the emitters tied to a common current sink Icont2. The bases of the transistors Q1 and Q2 serve as the non-inverted input 32a and inverted input 32b for the TAS circuit 22. As illustrated, the non-inverted output 23a and inverted output 23b of the TAS circuit 22 are connected to the non-inverted input 25a and inverted input 25b of the TIS circuit 24. Current driver Icont2 is preferably a conventional current mirror and sinks a magnitude of current which is dependent on a control signal. Transmission lines T1 and T2 may be interposed between the outputs 23a, 23b of the TAS circuit 22 and the inputs 25a, 25b of the TIS circuit 22. The nominal frequency range of oscillation of the circuit 20 may be adjusted by selecting the length of the transmission lines T1, T2 appropriately.

The TIS limiting amplifier circuit 24 is a form of differential current amplifier having inputs 25a and 25b, discussed above, which drive transistors Q4 and Q3, respectively, a non-inverted output 30a provided by transistors Q6 and Q8, arranged in an emitter-follower configuration, and an inverted output 30b, provided by transistors Q5 and Q7. The emitters of transistors Q8 and Q7 are connected to current sinks Ia and Ib, respectively, which may simply be an appropriately sized resistor. The emitters of transistors Q3 and Q4 are tied together and connected to current sink Icont1. Current driver Icont1 is preferably a conventional current mirror and sinks a magnitude of current which is dependent on a control signal and which is greater than currents Ia and Ib. The outputs 30a, and 30b are cross-coupled to the inputs 32b, 32a of the TAS circuit 22.

The frequency response of the TIS stage depends on the overall gain of the differential amplifier formed by Q3, Q4 and RL, the bandwidth of the amplifier, and the feedback resistor, RL. The amplifier gain is set by choosing RL and the magnitude of current Icont1. The bandwidth of the amplifier is dependent on the size of transistors Q3–Q8 and the magnitude of RL. The magnitudes of the components are selected to provide a gain peak at the frequency of interest. As the ratio of RL to RF is increased, the peaking can be made higher. As gain A is increased, the peaking increases. In general, the precise transfer function and frequency of peaking depends on the interaction between all the above parameters and the specific transistor configuration and technology at issue. Various techniques are available for selecting appropriate design parameters to provide the desired peaking effect, which techniques will be known to those of skill in the art.

To provide for high operating speeds, the transistors should be made as small as practical for the given technology. In a particular implementation of the circuit, Icont1 sinks a current of about 8 ma, Icont2 sinks a current of about 4 ma, Ia and Ib are both about 3 ma and all resistors are approximately 100 ohms. Voltage control of oscillation frequency is realized by varying the DC current Icont1 in the TIS amplifier. Icont2, the current in the TAS can also be used as an additional knob to tune the oscillation frequency.

While the invention has been particularly shown and described with reference to preferred embodiments thereof, it will be understood by those skilled in the art that various changes in form and details may be made therein without departing from the spirit and scope of the invention.

What is claimed is:

1. A single stage voltage controlled ring oscillator comprising:

a trans-admittance circuit receiving a voltage as input and producing an output current having a magnitude proportional to the input voltage; and a trans-impedance circuit receiving the output current of the trans-admittance circuit as input and producing an output voltage having a magnitude proportional to the input current, the output of the trans-impedance circuit connected to the input of the trans-admittance circuit;

wherein the trans-admittance circuit and the trans-impedance circuit are conjugately matched at a desired frequency of operation, and the trans-admittance circuit converts input voltages to output currents and the trans-impedance circuit converts to output voltages.

2. The oscillator of claim 1, wherein the trans-impedance circuit comprises a limiting amplifier.

3. The oscillator of claim 2, wherein the limiting amplifier is configured to have a peak gain at a predetermined frequency of oscillation.

4. The oscillator of claim 2, wherein the limiting amplifier comprises a voltage controlled current driver, a frequency of oscillation being adjustable by varying the magnitude of current driven by the current driver.

5. The oscillator of claim 2, further comprising a transmission line having a length coupled between the output of the trans-admittance circuit and the input of the trans-impedance circuit, a frequency of oscillation being determined by the length of the transmission line.

* * * * *

UNITED STATES PATENT AND TRADEMARK OFFICE
CERTIFICATE OF CORRECTION

PATENT NO. : 6,297,706 B1
DATED : October 2, 2001
INVENTOR(S) : Rajasekhar Pullela It is certified that error appears in the above-identified patent and that said Letters Patent is hereby corrected as shown below:

<u>Title page,</u>
Item [56], References Cited, U.S. PATENT DOCUMENTS,

| -- 5,428,318 | 06/27/95 | Razavi | 02/15/94 |
| 5,420,547 | 05/30/95 | Kikuchi | 06/17/94 |
| 5,917,383 | 06/29/99 | Tso et al. | 11/26/97 -- |

Signed and Sealed this

Tenth Day of September, 2002

Attest:

Attesting Officer

JAMES E. ROGAN
*Director of the United States Patent and Trademark Office*